US005313208A

United States Patent [19]

Bellini

[11] Patent Number: 5,313,208

[45] Date of Patent: May 17, 1994

[54] METHOD OF TRANSMITTING ANALOG SIGNALS IN DIGITAL FORM

[76] Inventor: Mario Bellini, Via Stretta, 196, Brescia, Italy, 25060

[21] Appl. No.: 916,060

[22] Filed: Jun. 26, 1992

[30] Foreign Application Priority Data

Jul. 26, 1991 [IT] Italy .......................... MI91A 002083

[51] Int. Cl.[5] .............................................. H03M 1/50

[52] U.S. Cl. ..................................... 341/166; 341/158

[58] Field of Search ............... 341/155, 157, 158, 166, 341/172

[56] References Cited

U.S. PATENT DOCUMENTS

| | | | |
|---|---|---|---|
| 3,390,354 | 6/1968 | Munch | 341/166 |
| 3,768,310 | 10/1973 | Krepak | 341/166 |
| 4,077,030 | 2/1978 | Helava | 340/183 |
| 4,779,074 | 10/1988 | Whitford et al. | 341/166 |
| 4,973,962 | 11/1990 | Shimizu | 341/166 |
| 5,014,058 | 5/1991 | Horn | 341/166 |
| 5,148,171 | 9/1992 | Blumberg | 341/168 |

*Primary Examiner*—Marc S. Hoff
*Attorney, Agent, or Firm*—Wenderoth, Lind & Ponack

[57] ABSTRACT

The method of transmitting analog signals in digital from resides in converting the analog signals to be transmitted into two digital signals, the duration of which is proportional to the analog signals and to their full-scale value, respectively. The so transmitted information is reconverted into the original value by simply calculating the ratio of the duration of the two digital signals.

8 Claims, 2 Drawing Sheets

METHOD OF TRANSMITTING ANALOG SIGNALS IN DIGITAL FORM

BACKGROUND OF THE INVENTION

1. Field of the Invention

The present invention generally relates to the field of machine automation, wherein one or more variables to be measured are of analog type, and, particularly, to an improved method of converting and transmitting analog signals.

DESCRIPTION OF THE PRIOR ART

As is known, in industry applications it is often necessary to measure analog signals, for example voltages or currents generated by various transducers which convert the value of a physical quantity to be measured into electrical signals according to a certain law (generally the transducers are linear). These voltage or current signals are transmitted as such on a plurality of cables and this causes some disadvantages, as for example:

1) electromagnetic noise given by the closeness of electric, magnetic or electromagnetic fields which can significantly alter the shape of the transmitted signals;
2) distorsion of the signal shape due to the cable impedance. This phenomenon can be very "tiresome" for very long cables (10 meters or more).

Such disadvantages must be totally or at least in part removed in order to increase the operational safety of the machines under control.

SUMMARY OF THE INVENTION

The object of the present invention is to obviate these and other disadvantages by providing an improved transmission method which allows an intrinsic and high noise immunity to be attained.

According to the present invention, the method of transmitting analog signals in digital form comprises the steps of:

comparing the analog signal to be transmitted with a reference and fixed analog signal;

forming, based on this comparison, a digital information in the form of two square signals having a constant and fixed amplitude and a duration directly determined by said comparison, transmitting on a single two-wire cable said digital information; and converting said digital information transmitted on said single two-wire cable into a binary value corresponding to the original analog signals by measuring the square signal durations, calculating the ratio therebetween and multiplying the so obtained value by the digital number corresponding to the conversion of the value of the reference analog signal.

DESCRIPTION OF THE PREFERRED EMBODIMENT

Before describing this invention it is necessary to state that the analog signals to be transmitted are referred to as electric voltages throughout the description.

The principle on which the present invention is based for converting analog signals into digital signals to be transmitted is to compare the input voltage Vin, coming from a transducer, with a reference voltage Vref which is constant and generally has the same value as the full-scale value of the input voltage Vin and to generate from this comparison two square signals, which are then transmitted on a single two-wire cable.

Figure 1:
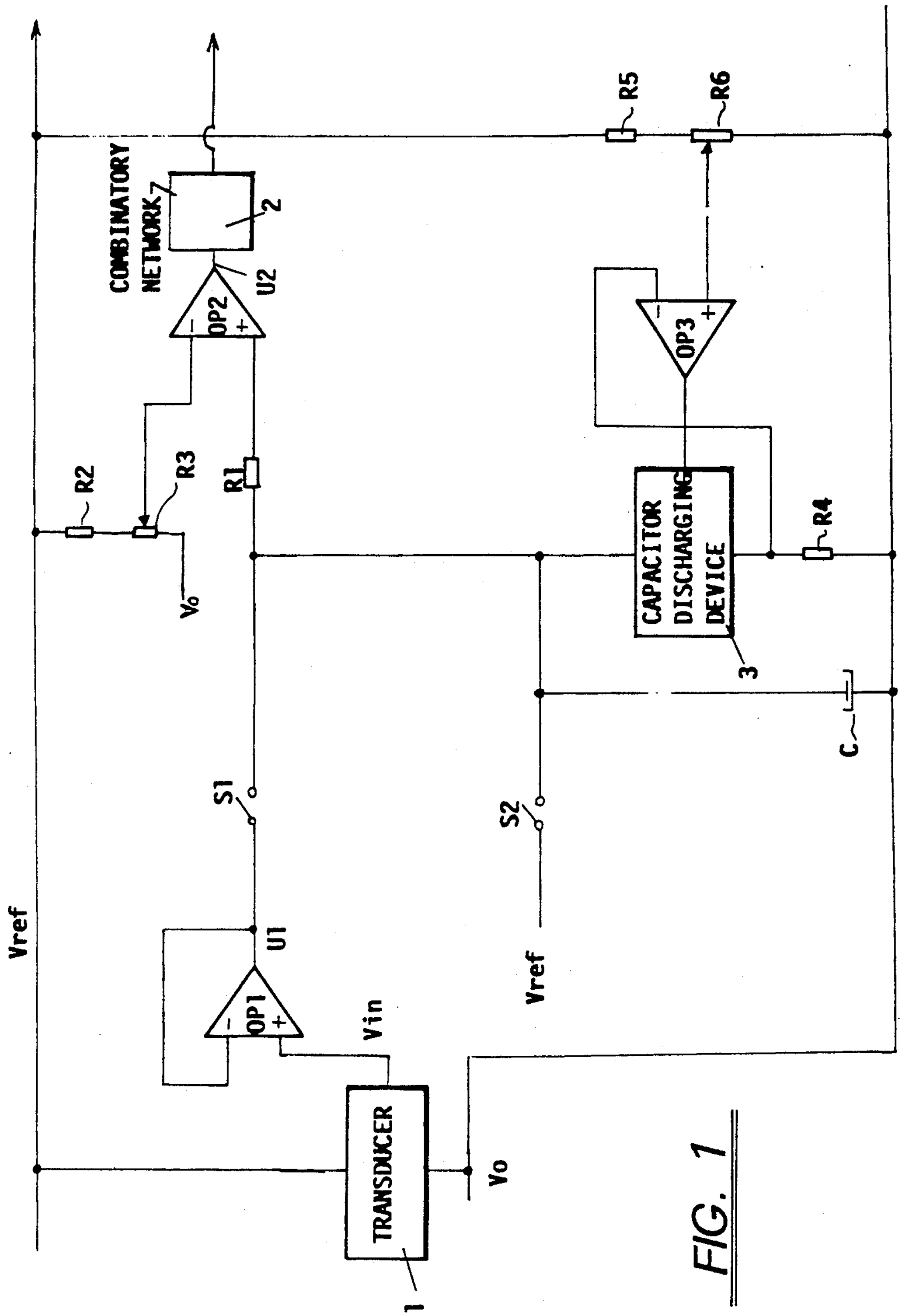
FIG. 1 shows a circuit diagram of the device for transmitting in digital form analog signals according to the invention.

In FIG. 1 there is shown by way of example a device operating according the principle of the present invention.

As can be seen from FIG. 1, the device generating the analog signals to be transmitted, in this case a transducer 1, is supplied with the reference voltage Vref and the voltage Vo. The input voltage Vin delivered by the transducer is the voltage which is to be transmitted in digital form. This input voltage Vin is applied to the plus input of an operational amplifier OP1 acting as a unity gain buffer (a very high input impedance is obtained), the output U1 of which is connected through a switch S1 and a resistor R1, to the plus input of an operational amplifier OP2 acting as a threshold comparator. The minus input of the operational amplifier OP2 is connected to a voltage divider R2,R3 establishing the comparision threshold voltage Vs. A capacitor C is connected across the of the reference voltage Vref and the voltage Vo and is controlled by a switch S2. By closing the switch S1 the capacitor C is charged (with a time constant of about 0) and by opening the switch S1 and closing the switch S2 the capacitor C is discharged with a constant current. As long as the voltage of the capacitor C is higher then the threshold voltage Vs established for the comparator OP2, the output U2 of the operational amplifier OP2 is in a high logic state. At the time in which the voltage of the capacitor C reaches said threshold voltage Vs, the output U2 of the operational amplifier OP2 is in a low logic state. The output U2 of the operation amplifier OP2 is connected for example to a combinatory network 2 which generates the signals for opening and closing the switches S1 and S2 and generates the output to be supplied to the two-wire cable in the following manner: logic state high if both the switches S1 and S2 are open, logic state low if one of the switches S1 and S2 is closed. In this manner the first of the two square signals is generated. With a similar procedure the capacitor C is then charged up to the reference voltage Vref and then discharged with a constant current for generating the second square signal to be supplied to the two-wire cable.

The device for discharging with a constant current the capacitor C comprises the operational amplifier OP3 acting as a comparator, the voltage divider formed by the resistors R5, R6 used for fixing the value of the discharging current and the device 3, which can be for example a transistor. This device causes the discharge current of the capacitor C flowing through the resistor R4, to follow the relation:

$$I_{discharge} = Vr6/R4$$

where Vr6 is the voltage set by the voltage divider formed by the resistors R5 and R6.

Figure 2:
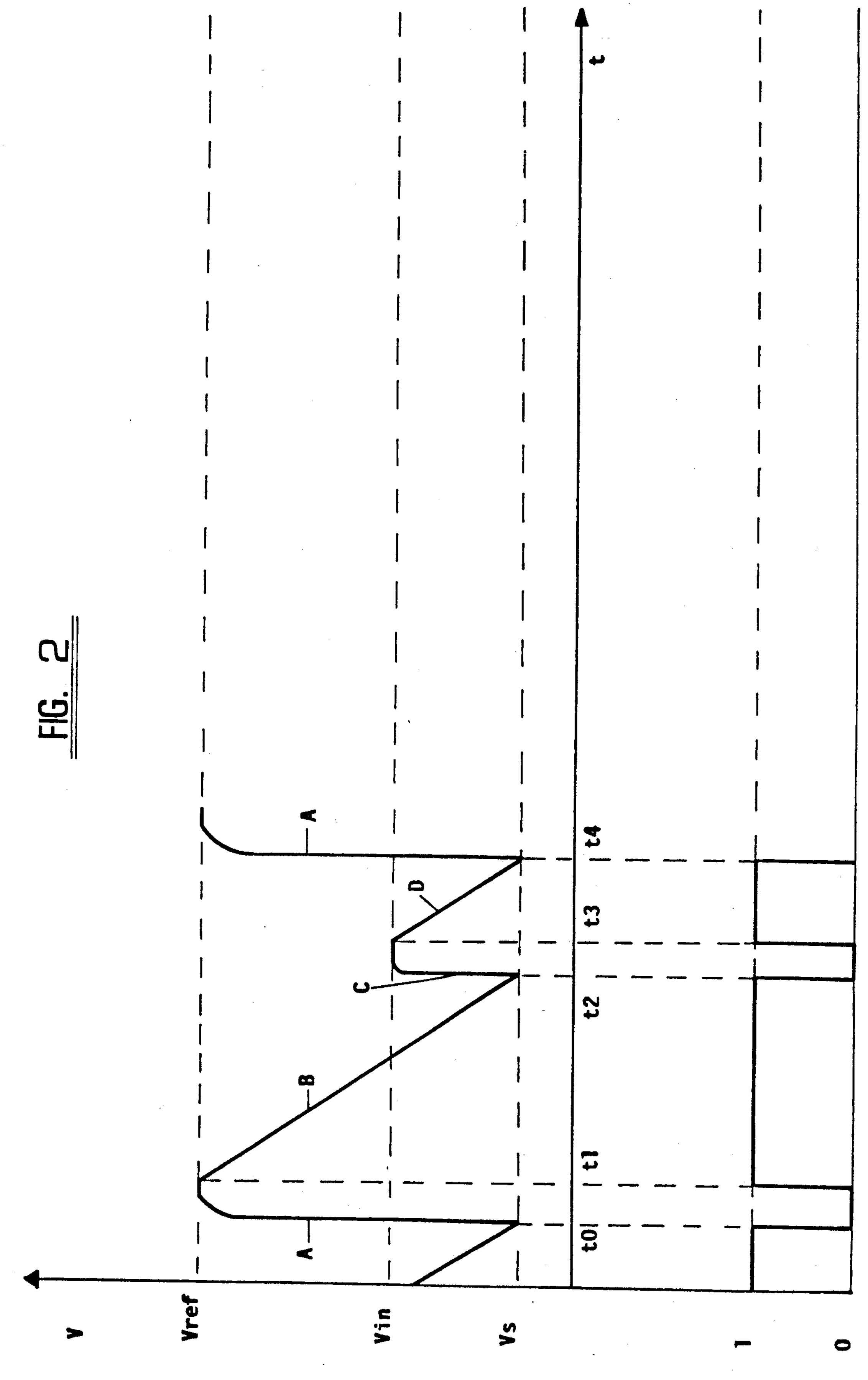
FIG. 2 is a plot of the waveform representing the charging and discharging current of a capacitor and the waveform obtained for the transmission in a digital form.

FIG. 2 describes the waveform generated in the charging and discharging operations of the capacitor C (upper diagram) and the obtained digital signals which are transmitted on the two-wire cable (lower diagram).

The upper diagram is plotted on a reference orthogonal cartesian system showing time t in the abscissa the voltage V of the capaictor C in the ordinate.

The first segment of the plotted curve, indicated by A, represents the voltage V of the capacitor C in the time interval t0−t1 during the capacitor charging operation (time constant=0) up to the reference value Vref.

The second segment, indicated by B, represents the voltage V of the capacitor C in the time interval t1−t2 during the capacitor discharging operation with a constant current up to the threshold voltage Vs given by the voltage divider R2,R3.

The segments indicated by C and D, respectively represent the voltage of the capacitor C in the time interval t3−t4 during the capacitor charging operation up to the input voltage Vin and the subsequent capacitor discharging operation with a constant current up to the threshold voltage Vs, respectively.

The lower diagram shows the logic states (high (1) and low (0)) of the signals to be supplied on the two-wire cable for the transmission. As can be noted, the signals are high only at the occurrence of the capacitor discharge with a constant current both starting from the reference voltage Vref and from the input voltage Vin (segments B and D). The ratio:

$$\frac{(t4 - t3)}{(t2 - t1)}$$

multiplied by the binary number corresponding to the conversion of the reference voltage Vref is a binary number representing the input voltage Vin.

So that the value of the threshold voltage Vs (which even if small is not null) cannot influence the precision of the measurement it is necessary to translate (for example by means of an adding circuit) the signal Vin by a quantity equal to the threshold voltage Vs and to set a reference voltage equal to the selected reference voltage Vref plus the threshold voltage Vs. In this manner t2−t1 is proportional to the selected reference voltage Vref and therefore is in a correspondence with the digital full-scale value, whereas t4−t3 is proportional to the input voltage Vin and therefore is in a correspondence with the binary value of the input voltage Vin.

Of course, the waveforms which are obtained by means of the capacitor discharge, are only an indicative and not binding example of how they can be obtained because it is understood that they can be generated in other manners than that described without departing from the scope of the invention.

It should be apparent that the method according to the invention solves in a very advantages manner the transmission of analog signals because the information contents thereof is converted into a digital signal and is transmitted as such.

What is claimed is:

1. Method of transmitting analog signals in digital form, particularly for industry automation applications, comprising the steps of:
   - comparing the analog signal to be transmitted with a reference and fixed analog signal;
   - forming, based on this comparison, a digital information in the form of two square signals having a constant and fixed amplitude and a duration directly determined by said comparison,
   - transmitting on a single two-wire cable said digital information; and
   - converting said digital information transmitted on said single two-wire cable into a binary value corresponding to the original analog signals by measuring the square signal duration, calculating the ratio therebetween and multiplying the so obtained value by the digital number corresponding to the conversion of the value of the reference analog signal.

2. Method according to claim 1, wherein said analog signals are physical quantities converted into electric signals.

3. Method according to claim 2, wherein said comparison of the analog signal to be transmitted with a reference and fixed analog signal is made by using an operational amplifier acting as a comparator.

4. Method according to claim 3, wherein said obtained digital signals are proportional to the discharging times of a capacitor which is charged up to a reference voltage (Vref) and discharged to a threshold voltage (Vs), charged again to an input voltage (Vin) and discharged again to said threshold voltage (Vs).

5. Method according to claim 2, wherein said obtained digital signals are proportional to the discharging times of a capacitor which is charged up to a reference voltage (Vref) and discharged to a threshold voltage (Vs), charged again to an input voltage (Vin) and discharged again to said threshold voltage (Vs).

6. Method according to claim 1, wherein said comparison of the analog signal to be transmitted with a reference and fixed analog signal is made by using an operational amplifier acting as a comparator.

7. Method according to claim 6, wherein said obtained digital signals are proportional to the discharging times of a capacitor which is charged up to a reference voltage (Vref) and discharged to a threshold voltage (Vs), charged again to an input voltage (Vin) and discharged again to said threshold voltage (Vs).

8. Method according to the claim 1, wherein said obtained digital signals are proportional to the discharging times of a capacitor which is charged up to a reference voltage (Vref) and discharged to a threshold voltage (Vs), charged again to an input voltage (Vin) and discharged again to said threshold voltage (Vs).

* * * * *